US009130095B2

(12) United States Patent
Kim et al.

(10) Patent No.: US 9,130,095 B2
(45) Date of Patent: Sep. 8, 2015

(54) SUBSTRATE FOR POWER MODULE HAVING UNIFORM PARALLEL SWITCHING CHARACTERISTIC AND POWER MODULE INCLUDING THE SAME

(71) Applicant: Samsung Electronics Co., Ltd., Suwon-Si, Gyeonggi-Do (KR)

(72) Inventors: Che-Heung Kim, Yongin-si (KR); Young-hun Byun, Seoul (KR); Seong-woon Booh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 149 days.

(21) Appl. No.: 13/920,732

(22) Filed: Jun. 18, 2013

(65) Prior Publication Data

US 2014/0120774 A1    May 1, 2014

(30) Foreign Application Priority Data

Nov. 1, 2012    (KR) .................. 10-2012-0123090

(51) Int. Cl.
*H01R 24/00*     (2011.01)
*H01L 31/05*     (2014.01)

(52) U.S. Cl.
CPC ..... *H01L 31/0504* (2013.01); *H01L 2224/4846* (2013.01); *H01L 2224/48472* (2013.01); *H01L 2224/49111* (2013.01); *H01L 2924/1305* (2013.01); *H01L 2924/13055* (2013.01); *Y02E 10/50* (2013.01)

(58) Field of Classification Search
CPC .. H01R 13/2442; H01R 13/514; H01R 12/57; H01R 11/32; G06K 7/0021
USPC .................................. 439/626, 76.2
See application file for complete search history.

(56) References Cited

U.S. PATENT DOCUMENTS

| | | | | | |
|---|---|---|---|---|---|
| 5,812,387 | A | * | 9/1998 | Lu et al. ................. | 363/144 |
| 6,005,773 | A | * | 12/1999 | Rozman et al. ............ | 361/707 |
| 6,965,517 | B2 | * | 11/2005 | Wanes et al. .............. | 361/760 |
| 7,046,535 | B2 | * | 5/2006 | Rodriguez et al. ......... | 363/146 |
| 7,289,329 | B2 | * | 10/2007 | Chen et al. ............... | 361/707 |
| 7,289,343 | B2 | * | 10/2007 | Rodriguez et al. ......... | 363/146 |

(Continued)

FOREIGN PATENT DOCUMENTS

| | | |
|---|---|---|
| EP | 2317551 A1 | 5/2011 |
| JP | 2009219273 A | 9/2009 |

(Continued)

*Primary Examiner* — Abdullah Riyami
*Assistant Examiner* — Vladimir Imas
(74) *Attorney, Agent, or Firm* — Harness, Dickey & Pierce, P.L.C.

(57) ABSTRACT

Provided are a substrate for a power module having a uniform parallel switching characteristic and a power module including the same. The substrate for the power module includes a plurality of areas on which input terminals are mounted, an area on which an output terminal is mounted, a plurality of areas on which devices are mounted, and an area on which a plurality of control pins are mounted. The plurality of areas on which the devices are mounted are bilaterally symmetric about the area on which the plurality of control pins are mounted. The plurality of areas on which the input terminals are mounted, respectively, are provided into three areas spaced apart from each other and bilaterally symmetric to each other. The plurality of areas on which the device are mounted are bilaterally symmetric about the area on which the control pins are mounted.

19 Claims, 7 Drawing Sheets

(56) References Cited

U.S. PATENT DOCUMENTS

| | | | |
|---|---|---|---|
| 7,292,451 B2 * | 11/2007 | Rodriguez et al. | 361/775 |
| 7,295,448 B2 * | 11/2007 | Zhu | 363/17 |
| 7,301,755 B2 * | 11/2007 | Rodriguez et al. | 361/676 |
| 7,327,024 B2 | 2/2008 | Stevanovic et al. | |
| 7,561,429 B2 * | 7/2009 | Yahata et al. | 361/715 |
| 7,705,443 B2 * | 4/2010 | Yokomae et al. | 257/690 |
| 7,923,300 B2 * | 4/2011 | Bell et al. | 438/123 |
| 8,018,730 B2 * | 9/2011 | Onishi et al. | 361/763 |
| 8,031,479 B2 * | 10/2011 | Nagashima et al. | 361/781 |
| 8,035,982 B2 * | 10/2011 | Kontani et al. | 361/782 |
| 8,076,696 B2 * | 12/2011 | Beaupre et al. | 257/177 |
| 8,129,836 B2 * | 3/2012 | Takano et al. | 257/691 |
| 8,240,411 B2 * | 8/2012 | Nakatsu et al. | 180/65.21 |
| 8,422,235 B2 * | 4/2013 | Azuma et al. | 361/736 |
| 8,461,669 B2 * | 6/2013 | Yang et al. | 257/673 |
| 8,482,904 B2 * | 7/2013 | Darroman et al. | 361/624 |
| 8,736,043 B2 * | 5/2014 | Konno et al. | 257/693 |
| 8,824,125 B1 * | 9/2014 | Cox et al. | 361/622 |
| 8,878,483 B2 * | 11/2014 | Darroman et al. | 320/107 |
| 2007/0051974 A1 | 3/2007 | Azuma et al. | |
| 2011/0310585 A1 | 12/2011 | Suwa et al. | |

FOREIGN PATENT DOCUMENTS

| | | |
|---|---|---|
| JP | 2012064609 A | 3/2012 |
| KR | 20040080949 A | 9/2004 |
| KR | 20050009128 A | 1/2005 |
| KR | 20080088466 A | 10/2008 |
| KR | 20100010494 A | 2/2010 |

* cited by examiner

SUBSTRATE FOR POWER MODULE HAVING UNIFORM PARALLEL SWITCHING CHARACTERISTIC AND POWER MODULE INCLUDING THE SAME

CROSS-REFERENCE TO RELATED APPLICATIONS

This application claims the benefit of Korean Patent Application No. 10-2012-0123090, filed on Nov. 1, 2012, in the Korean Intellectual Property Office, the disclosure of which is incorporated herein in its entirety by reference.

BACKGROUND

1. Field

Example embodiments relate to a semiconductor device module.

2. Description of the Related Art

Power modules are packaged electronic parts which achieve various power conversions between Direct Current (DC) and Alternating Current (AC) such as DC/DC, DC/AC, AC/DC, or AC/AC using a plurality of switching devices and adequate passive devices. Representative examples of these power modules include a DC-DC converter, an AC-DC changer, a DC-AC inverter, and the like. Power modules may be used in various fields such as the buck/boost for electronic devices, charging, generation/power transmission, the driving of a driver, and the like.

Recently, as interest in electric vehicles and new renewable energy sources increases and the corresponding technology develops, power modules that have a relatively high capacity and high power density are being developed. However, these power modules may be susceptible to a high current interruption.

To overcome the high current interruption, conventionally, unit switching devices that have limited capacities are connected parallel to each other. However, between the unit switching devices a switching current non-uniformity may occur. The switching current non-uniformity may cause power consumption to be concentrated in one switching device. Thus, the corresponding switching device may be damaged. Furthermore, the load in the rest of the switching devices may be increased and may result in a breakdown of the whole module.

Since general parallel operational devices are connected to the same electrical terminal at a time, it may be difficult to individually control the devices. Further, even if a layout is designed to individually control the devices, the layout may be inefficient in economic and technical feasibility.

SUMMARY

Provided is a substrate for power module having a uniform parallel switching characteristic.

Provided is a power module including the substrate for power module having a uniform parallel switching characteristic.

Additional aspects will be set forth in part in the description which follows and, in part, will be apparent from the description, or may be learned by practice of the presented embodiments.

According to an example embodiment, a substrate includes: a plurality of areas on which input terminals are mounted; an area on which an output terminal is mounted; a plurality of areas on which devices are mounted; and an area on which a plurality of control pins are mounted, wherein the plurality of areas on which the devices are mounted are bilaterally symmetric about the area on which the plurality of control pins are mounted.

The plurality of areas on which the input terminals are mounted, respectively, may be provided into three areas spaced apart from each other and be bilaterally symmetric to each other.

The plurality of areas on which the devices are mounted may be provided into four areas, wherein two areas of the four areas may be conductive layer areas spaced apart from each other, and remaining two areas may be the same conductive layer area.

A second substrate may be mounted on the area on which the plurality of control pins are mounted.

The second substrate may include: an insulation layer contacting the area on which the plurality of control pins are mounted; and a plurality of conductive layers spaced apart from each other, the plurality of conductive layers being disposed on the insulation layer.

According to another example embodiment, a power module includes: a substrate including a plurality of input terminal areas configured to mount input terminals thereon, an output terminal area configured to mount an output terminal thereon, a plurality of device areas configured to mount devices thereon, and a control pin area configured to mount control pins thereon, wherein the plurality of device areas are bilaterally symmetric about the control pin area; first devices mounted on the plurality of device areas; first input terminals mounted on the plurality of input terminal areas; first control pins mounted on the control pin area; and a first output terminal mounted on the output terminal area.

A second substrate may be mounted on the control pin area.

The second substrate may include: an insulation layer; and a plurality of conductive layers disposed on the insulation layer, the plurality of conductive layers spaced apart from each other.

The first control pins may be mounted on the plurality of conductive layers.

The plurality of input terminal areas may include three areas spaced apart from each other and that are bilaterally symmetric to each other.

The first input terminals may be three first input terminals respectfully mounted on the three areas spaced apart from each other, and two of the three first input terminals are configured to receive a voltage having a same polarity.

The three first input terminals may be bilaterally symmetric to each other.

The three first input terminals may be bilaterally asymmetric to each other.

The three first input terminals may include two coupling parts.

The second substrate, a portion of the first devices and one of the first input terminals may be mounted on a same one of the plurality of conductive layers.

At least one example embodiment relates to a power module.

In one embodiment, a substrate includes device modules and control pins, input terminals and an output terminal. The control pins have first ends mounted to the substrate and the device modules are symmetrically mounted to the substrate with respect to the control pins, the control pins configured to receive a signal to control switching of the modules. The input terminals are electrically connected to the substrate, the input terminals being symmetrically mounted with respect to the control pins. The output terminal is electrically connected to the substrate, the output terminal being symmetrically mounted with respect to the control pins.

In one embodiment, the control pins are mounted along a center of the substrate.

In one embodiment, a variation in an inductance in each of the device modules is less than 15%.

In one embodiment, a second substrate is mounted to a second end of the control pins, the second substrate electrically insulated from the device modules.

In one embodiment, the input terminals include at least three input terminals and two of the three input terminals are configured to receive a voltage having a same polarity and a third of the three input terminals is configured to receive a voltage having a polarity opposite the same polarity.

In one embodiment, the device modules include an insulated-gate bipolar transistor IGBT.

BRIEF DESCRIPTION OF THE DRAWINGS

These and/or other aspects will become apparent and more readily appreciated from the following description of the embodiments, taken in conjunction with the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments of the invention are shown. In the drawings, the thicknesses of layers and regions are exaggerated for clarity.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the example embodiments are merely described below, by referring to the figures, to explain aspects of the present description FIG. 1 is a plan view illustrating a substrate (hereinafter, referred to as a power module substrate) for a power module according to an example embodiment.

Figure 1:
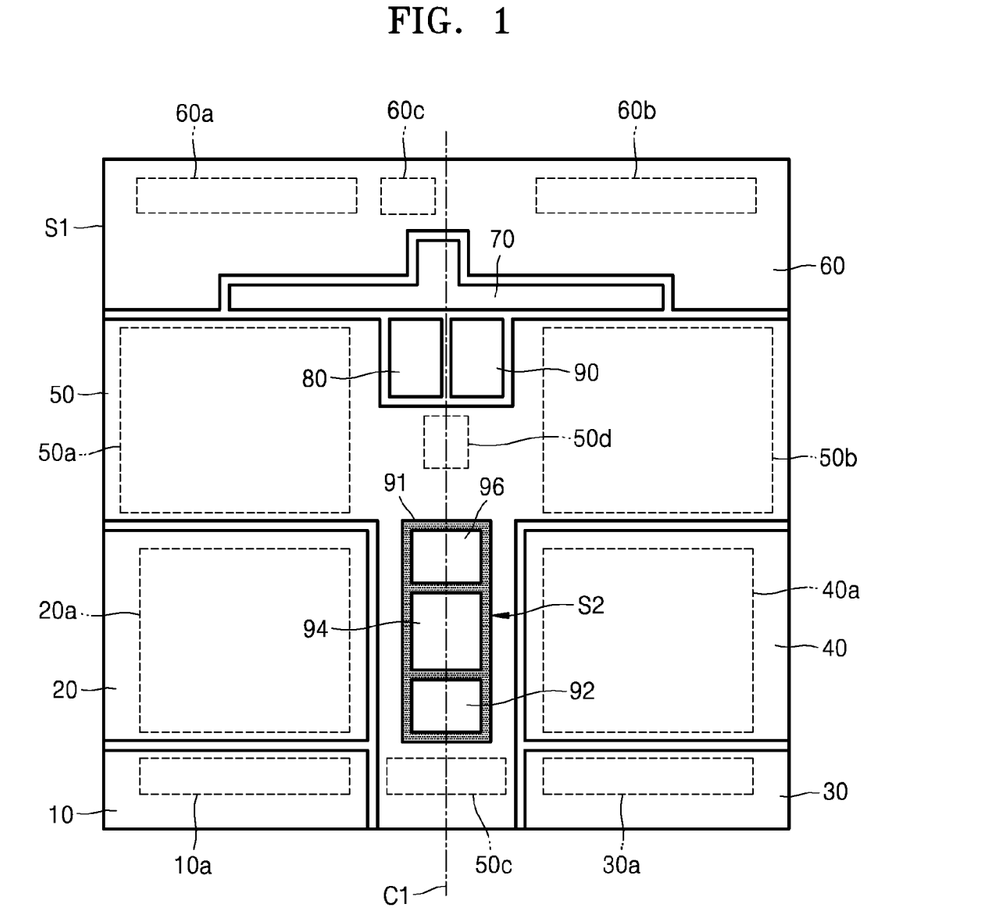
FIG. 1 is a plan view illustrating a substrate for a power module according to an example embodiment.

Referring to FIG. 1, a first substrate S1 may be, for example, a direct bonded copper (DBC) substrate. The first substrate S1 includes first to ninth portions 10, 20, 30, 40, 50, 60, 70, 80, and 90. Top surfaces of the first to ninth portions 10, 20, 30, 40, 50, 60, 70, 80, and 90 are covered by a conductive layer. Here, the conductive layer may be, for example, a copper layer. The first to ninth portions 10, 20, 30, 40, 50, 60, 70, 80, and 90 are spaced apart from each other. The first and second portions 10 and 20 and the third and fourth portions 30 and 40 may be bilaterally symmetric to each other about a central line C1. In bilateral symmetry (also called plane symmetry) a plane will divide a substrate in half. The fifth portion 50 may have a T shape. Here, the vertical portion of the fifth portion 50 is disposed between the first and second portions 10 and 20 and the third and fourth portions 30 and 40, and the horizontal portion of the fifth portion 50 is disposed on the second and fourth portions 20 and 40. The fifth portion 50 may be bilaterally symmetric about the central line C1. The sixth portion 60 may be disposed above the fifth portion 50 and bilaterally symmetric about the central line C1. The seventh portion 70 is disposed between the fifth portion 50 and the sixth portion 60. The seventh portion 70 includes a horizontal portion and an upwardly vertical portion.

A control pin (not shown) is mounted on the upwardly vertical portion of the seventh portion 70. Also, the seventh portion 70 may be bilaterally symmetric about the central line C1. The eighth and ninth portions 80 and 90 are disposed between the fifth portion 50 and the seventh portion 70. The eighth and ninth portions 80 and 90 may be bilaterally symmetric about the central line C1. A control pin (not shown) may be mounted on the eighth and ninth portions 80 and 90.

The first portion 10 includes a first area 10a. The first area 10a may be an area on which a terminal is mounted. The second portion 20 includes a second area 20a. The second area 20a may be an area on which a module including a plurality of devices is mounted. The second area 20a may be an area on which a terminal (not shown) is mounted. The third portion 30 includes a third area 30a. The third area 30a may be an area on which a terminal is mounted.

The fourth portion 40 includes a fourth area 40a. The fourth area 40a may be an area on which a module including a plurality of devices is mounted. The first and second areas 10a and 20a and the third and fourth areas 30a and 40a may be bilaterally symmetric to each other about the central line C1. Thus, the module mounted on the second area 20a and the module mounted on the fourth area 40a may be bilaterally symmetric to each other. Also, the terminal mounted on the first area 10a and the terminal mounted on the third area 30a may be bilaterally symmetric to each other. The fifth portion 50 includes fifth to eighth areas 50a to 50d. The fifth and sixth areas 50a and 50b may be areas on which modules are mounted, respectively. Also, the fifth and sixth areas 50a and 50b may be bilaterally symmetric about the central line C1. The seventh area 50c is disposed between the first and third areas 10a and 30a. Also, the seventh area 50c may be an area on which a terminal is mounted and be bilaterally symmetric about the central line C1. The eighth area 50d may be bilaterally symmetric about the central line C1 and be an area on which a control pin is mounted. The sixth portion 60 includes ninth to eleventh areas 60a, 60b, and 60c. The ninth and tenth areas 60a and 60b may be bilaterally symmetric about the central line C1. The ninth and tenth areas 60a and 60b may be areas on which output terminals or phase terminals are mounted, respectively. The eleventh area 60c may be disposed between the ninth and tenth areas 60a and 60b, i.e., between the ninth area 60a and the central line C1. The eleventh area 60c may be an area on which a control pin is mounted.

As described above, the areas of the power module substrate S1 on which the modules are mounted may be bilaterally symmetric about the central line C1. The areas on which input terminals and the output terminals are mounted may be bilaterally symmetric to each other. The control pins are mounted along the central line C1. Thus, a current path between the respective modules and the terminals, which are mounted on the power module substrate S1, may be reduced. Also, as coupling therebetween is increased, stray inductance may be reduced. Further, the symmetrical arrangement makes the switching characteristics of the devices arranged parallel uniform, therefore, power losses in the devices may be uniform increasing the life cycle of each device.

A second substrate S2 is mounted on the fifth portion 50 of the power module substrate S1. The second substrate S2 may be bilaterally symmetric about the central line C1. The second substrate S2 may be disposed between the second portion 20 and the fourth portion 40. The second substrate S2 may include an insulation layer 90 disposed on the fifth portion 50 and first to third conductive layers 92, 94, and 96 disposed on the insulation layer 90. The first and third conductive layers 92, 94, and 96 are spaced apart from each other. The second substrate S2 may be disposed on the fifth portion 50 without removing a portion of the fifth portion 50. Because the insulation layer 90 of the second substrate S2 contacts the fifth portion 50, the second substrate S2 may be decoupled from high current flowing into the fifth portion 50. The insulation layer 90 of the second substrate S2 may be, for example, a silicon oxide layer. Each of the first to third conductive layers 92, 94, and 96 may be, for example, a copper layer. A control pin may be disposed on each of the first to third conductive layers 92, 94, and 96. Since a control pin is mounted on a center of the substrate S1 by using the second substrate S2, an additional area due to the mounting of the control pin may not be required. Thus, the efficiency of a layout area of the substrate S1 may be improved.

Figure 2:
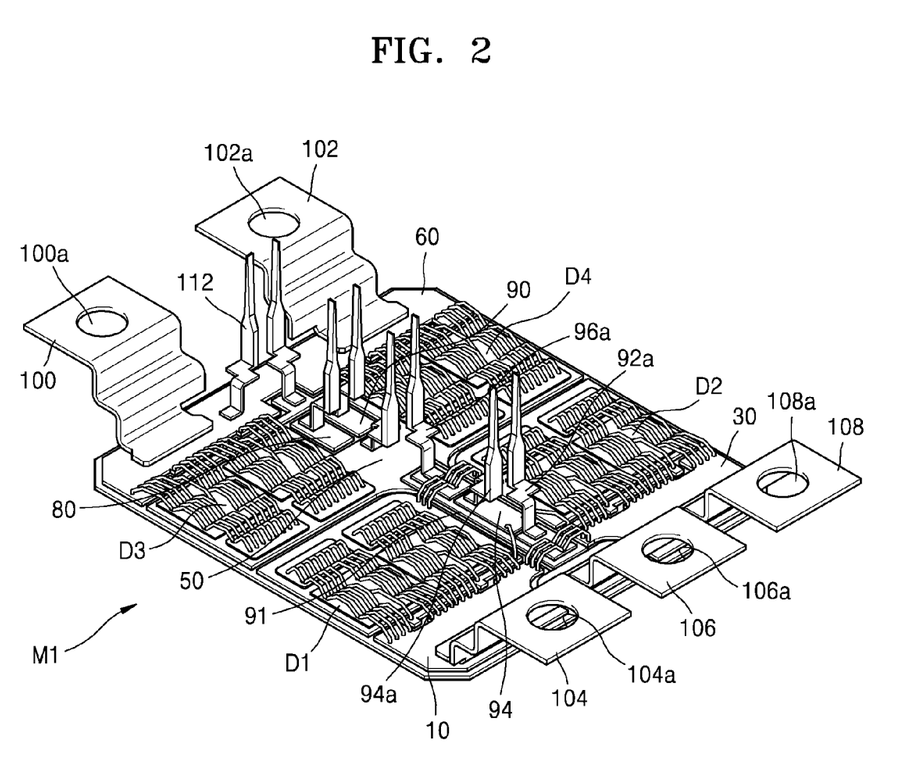
FIG. 2 is a perspective view illustrating a power module including the substrate for the power module of FIG. 1 according to an example embodiment.

FIG. 2 is a perspective view illustrating a power module including the substrate S1 for power module of FIG. 1 according to an example embodiment.

Referring to FIG. 2, in a power module M1, a first terminal 104 is mounted on the first portion 10, and a second terminal 108 is mounted on the third portion 30. Through holes 104a and 108a are defined in the first and second terminals 104 and 108, respectively. The through holes 104a and 108a may be configured to couple bolts. A third terminal 106 is mounted on the fifth portion 50. The third terminal 106 is disposed between the first and second terminals 104 and 108. The first and second terminals 104 and 108 may be bilaterally symmetric about the third terminal 106. A through hole 106a for coupling a bolt is defined in the third terminal 106. The first to third terminals 104, 108, and 106 may be input terminals, respectively. A voltage having the same first polarity may be applied into the first and second terminals 104 and 108. A voltage having a polarity opposite to the first polarity may be applied into the third terminal 106. For example, the voltage having the first polarity may be a positive (+) voltage.

A first device module D1 including a plurality of devices is mounted on an area corresponding to the second portion 20 of FIG. 1. A second device module D2 including a plurality of devices is mounted on an area corresponding to the fourth portion 40 of FIG. 1. Third and fourth device modules D3 and D4 are disposed on the fifth and sixth areas 50a and 50b of the fifth portion 50 of FIG. 1, respectively. Fourth and fifth terminals 100 and 102 are mounted on areas corresponding to the ninth and tenth areas 60a and 60b of the sixth portion 60, respectively. Each of the fourth and fifth terminals 100 and 102 may be an output terminal or a phase terminal. Through holes 100a and 102a for coupling bolts are defined in the fourth and fifth terminals 100 and 102, respectively. A control pin is mounted on an area of the fifth portion 50 corresponding to the eighth area 50a of FIG. 1. A control pin is mounted on each of the eighth and ninth portions 80 and 90. Also, a control pin is mounted on an area corresponding to the seventh portion 70 of FIG. 1. Also, a control pin 112 is mounted on an area corresponding to the eleventh area 60c of the sixth portion 60 of FIG. 1. Control pins 92a, 94a, and 96a are mounted on the first to third conductive layers 92, 94, and 96 disposed on the insulation layer 90, respectively. The first to third conductive layers 92, 94, and 96 are connected to the first to fourth portions 10, 20, 30, and 40 through wire bonding. The first device module D1 is wire-bonded to the first portion 10. The second device module D2 is wire-bonded to the third portion 30. The third device module D3 is wire-bonded to the second portion 20 and the sixth portion 60. The fourth device module D4 is wire-bonded to the fourth portion 40 and the sixth portion 60.

Figure 3:
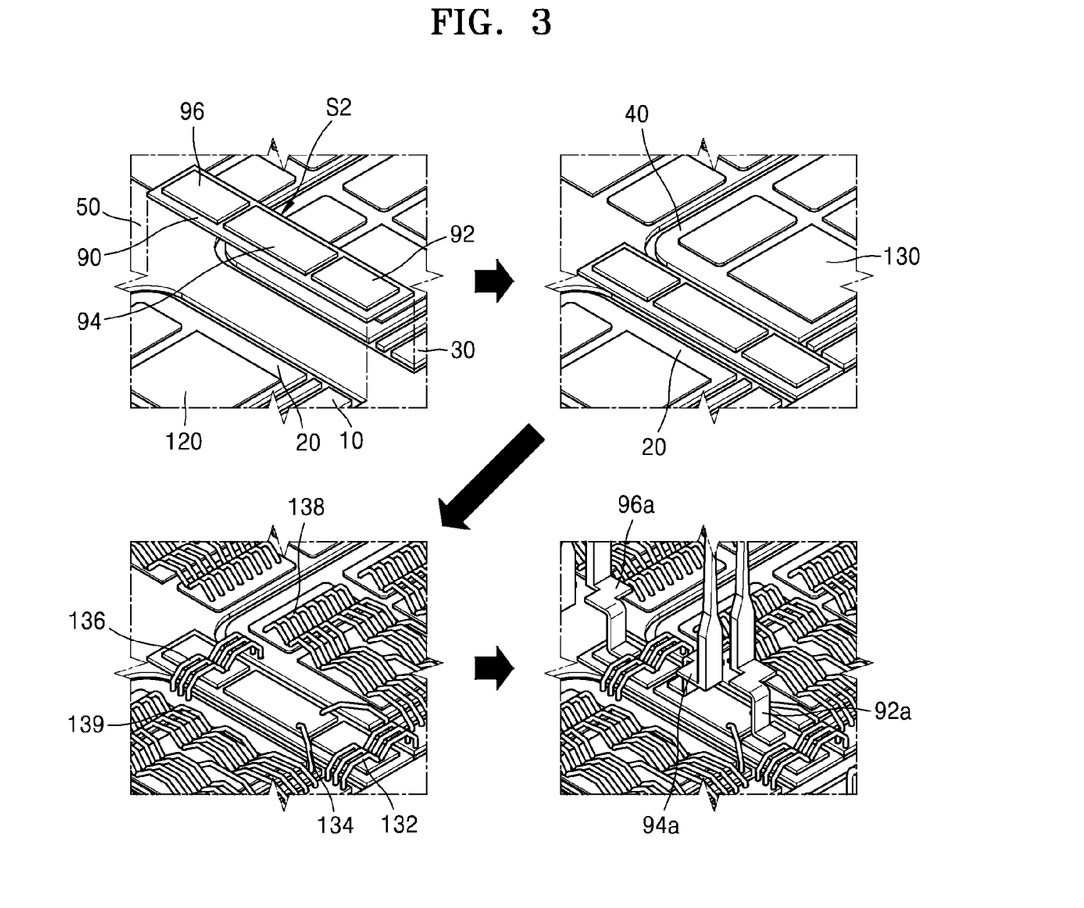
FIG. 3 is a perspective view illustrating a process of mounting a second substrate on the power module of FIG. 2.

FIG. 3 is a perspective view illustrating a process of mounting the second substrate S2 on the fifth portion 50 of the first substrate S1.

Referring to FIG. 3, the second substrate S2 is mounted on the fifth portion 50 between the second portion 20 and the fourth portion 40. The first conductive layer 92 is wire-bonded 132 to the first and third portions 10 and 30. The second conductive layer 94 is wire-bonded 134 to a desired (or alternatively, a predetermined) portion between the first and second portions 10 and 20. The third conductive layer 96 is wire-bonded 136 to the second and fourth portions 20 and 40. While the wire-bonding processes 132, 134, and 136 are performed, wire-bonding processes 138 and 139 of device modules to be mounted on the second and fourth portions 20 and 40 may be performed together. After the wire-bonding processes are performed, the control pins 92a, 94a, and 96a are mounted on the first to third conductive layers 92, 94, and 96, respectively. A reference numeral 120 represents a device mounted on the second portion 20, for example, device D1 which may be an Insulated-gate bipolar transistor IGBT. A reference numeral 130 represents a device, for example, device D2, mounted on the fourth portion 40.

FIG. 4 is a graphical view illustrating (a) an inductance variation with respect to devices D1-D4, for example IGBT1 to IGBT4, disposed parallel to each other and (b) a momentary power loss variation when the power module of FIG. 3 is turned off.

Figure 4A:
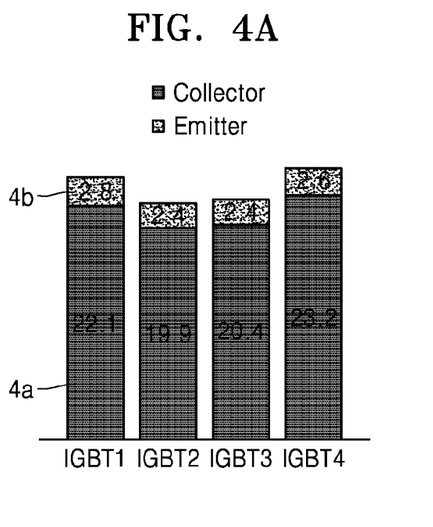
FIG. 4 is a graphical view illustrating (a) an inductance variation with respect to devices IGBT1 to IGBT4 disposed parallel to each other and (b) a momentary power loss variation when turned off in the power module of FIG. 3.
Figure 4B:
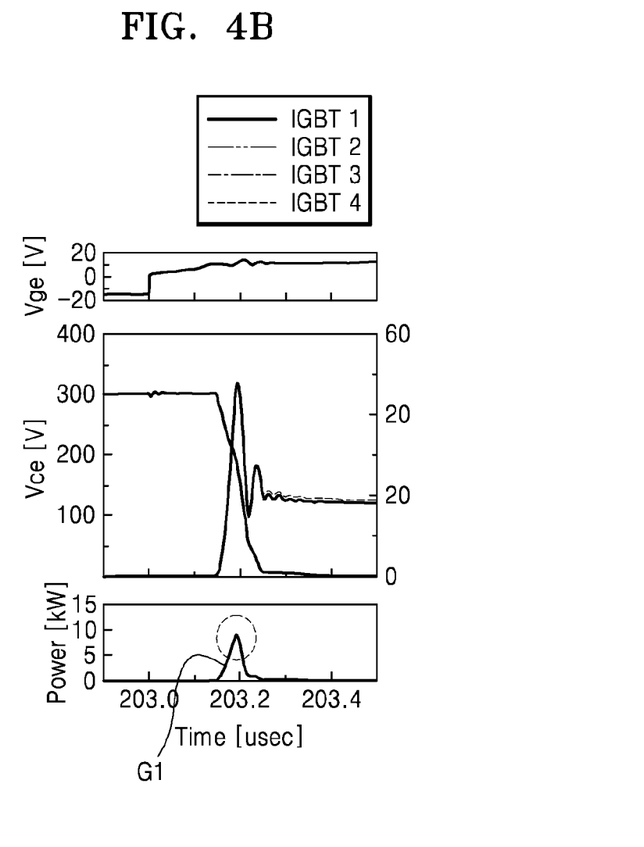

In the bar graph of FIG. 4A, a lower portion 4a represents a collector-side inductance variation of an IGBT, and an upper portion 4b represents an emitter-side inductance variation of the IGBT. In FIG. 4B, an upper graph represents a variation of a gate voltage, a middle graph represents a variation of a reference voltage, and a lower graph G1 represents a momentary power loss.

Referring to FIGS. 4A and 4B, a deviation in inductance among the respective devices may be only in about 15%. As shown in lower graph G1, there is no deviation in an amount of momentary power loss between the devices IGBT1 to IGBT4.

Figure 5:
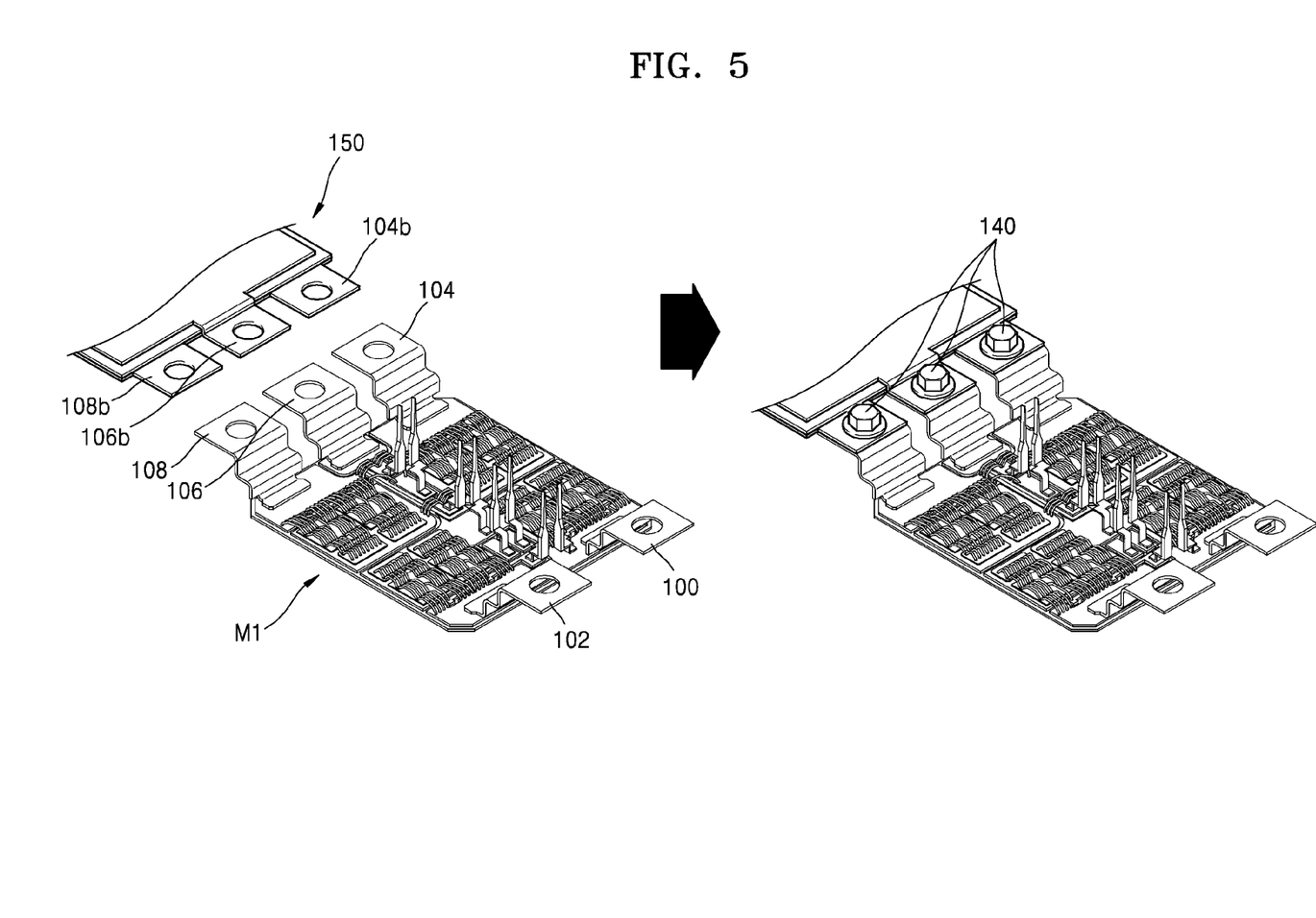
FIG. 5 is a perspective view illustrating a coupling between the power module of FIG. 2 and a busbar.

FIG. 5 is a perspective view illustrating a coupling between the power module of FIG. 2 and a busbar.

Referring to FIG. 5, first to third coupling ends 104b, 108b, and 106b are disposed on a busbar 150 to correspond to first to third terminals 104, 108, and 106 in a power module M1. When compared to a related art, one coupling end is further added to a busbar 150. The first to third terminals 104, 108, and 106 and the first to third coupling ends 104b, 108b, and 106b may be coupled to each other by using bolts 140, respectively.

Figure 6:
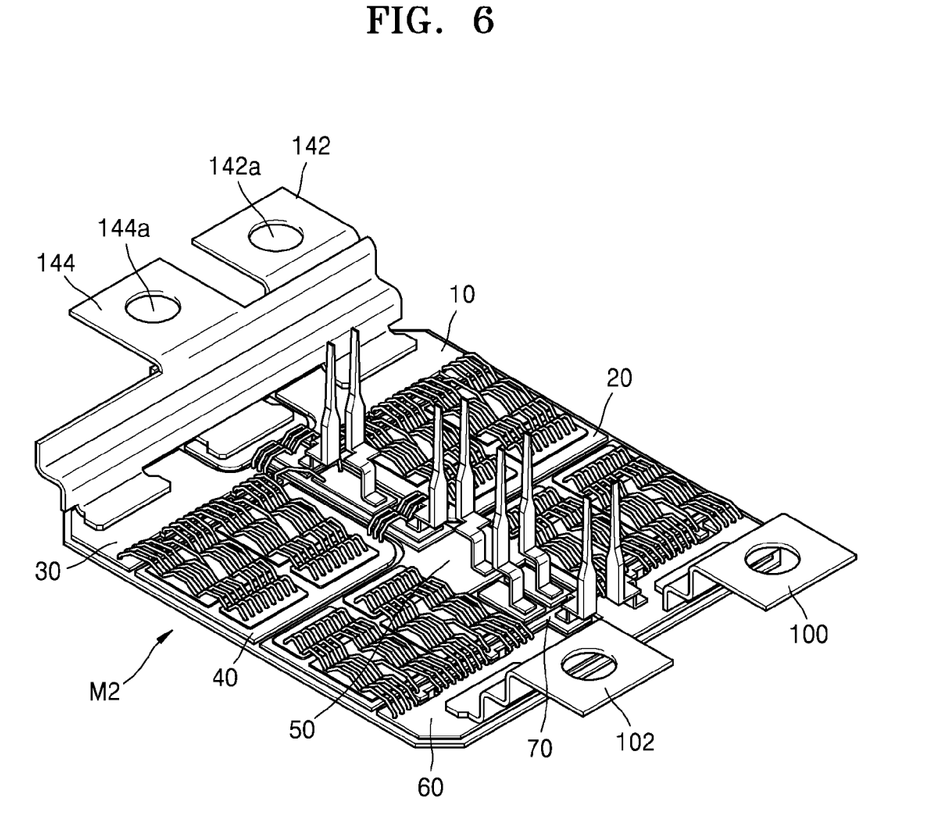
FIG. 6 is a perspective view illustrating a power module according to another example embodiment.

FIG. 6 is a perspective view illustrating a power module according to another example embodiment. Only the parts that are different from those of FIG. 1 will be described below. The same reference numeral represents the same member.

Referring to FIG. 6, when compared to the power module of FIG. 2, an input terminal of a power module M2 is modified, and the remaining portions are the same. Particularly, sixth and seventh terminals 142 and 144 are provided as input terminals, respectively. The sixth terminal 142 may be a terminal to which a negative (−) DC is applied and also the same as the third terminal 108 of FIG. 2. The seventh terminal 144 contacts a first portion 10 and a third portion 30. Thus, the seventh terminal 144 may have the same structure as that in which the first and second terminals 104 and 108 are connected to each other. A positive (+) DC may be applied into the seventh terminal 144. Through holes 142a and 144a for coupling are defined in the sixth and seventh terminals 142 and 144, respectively.

Figure 7:
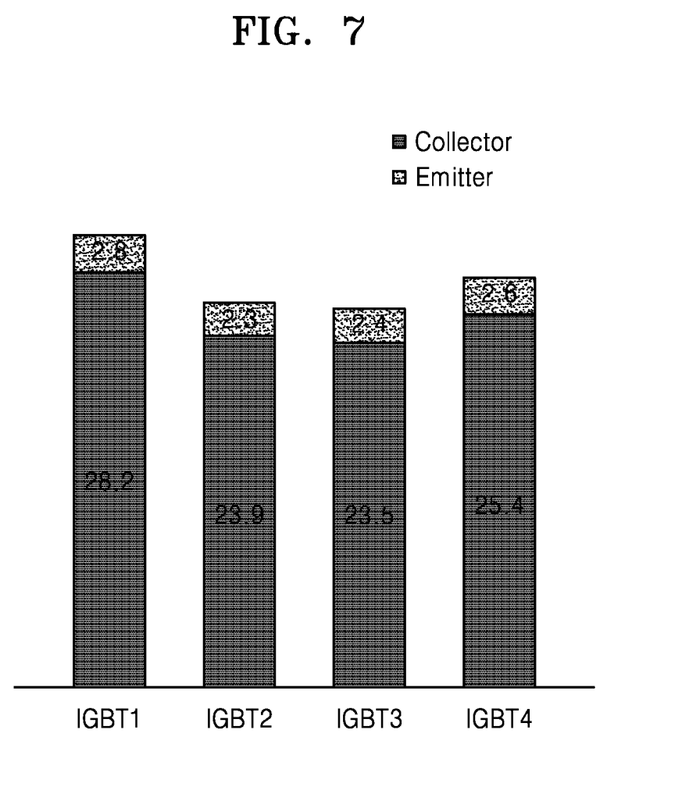
FIG. 7 is a bar graph illustrating an inductance variation with respect to each device in the power module of FIG. 6.

FIG. 7 is a bar graph illustrating an inductance variation with respect to each device in the power module M2 of FIG. 6. In the bar graph of FIG. 7, a lower portion 7a represents a collector-side inductance variation of the IGBT, and an upper portion 7b represents an emitter-side inductance variation of the IGBT.

Comparing the results obtained in FIG. 7 to those obtained in FIG. 4A, the power module M2 of FIG. 6 has a variation in inductance that is greater than that in the power module M1 of FIG. 2. However, the inductance variation in the power module M2 of FIG. 6 is still lower than that in existing power modules.

The power module according to the example embodiments may have a structure different from that of the existing power module. The devices in the power module may be bilaterally symmetric about the central axis, and the terminals may also be bilaterally symmetric about the central axis. Also, the control pins may be disposed on a center of the layout. Thus, the switching characteristic between the parallel switching devices may be uniform, and uniformity of the power loss with respect to each of the switching devices may be relatively improved, resulting in an increase in the life cycle of the devices including the power modules.

Also, the switching loss may be reduced due to the uniformity of the switching characteristic between the devices, and the efficiency of the power module may be improved due to the increase of the life cycle of the devices.

Also, the current path may be reduced by the two separated terminals having a symmetrical layout, and the stray inductance may be reduced due to the increase of the coupling therebetween.

Also, the added substrate may be vertically stacked on the module substrate to reduce an area of the layout.

It should be understood that the example embodiments described therein should be considered in a descriptive sense only and not for purposes of limitation. Thus, it will be understood by those of ordinary skill in the art that various changes in form and details may be made therein without departing from the spirit and scope of the present disclosure as defined by the following claims.

What is claimed is:

1. A substrate comprising:
   a plurality of input terminal areas on which input terminals are mounted;
   a plurality of output terminal areas on which output terminals are mounted;
   a plurality of device areas, at least one devices being mounted on respective ones of the plurality of device areas; and
   a plurality of control pin areas on which a plurality of control pins are mounted, wherein
   the plurality of control pin areas are disposed approximately along a center line connecting a central portion of the plurality of input terminal areas and a central portion of the plurality of output terminal areas, and
   the plurality of device areas are bilaterally symmetric about the plurality of control pin areas therebetween.

2. The substrate of claim 1, wherein the plurality of input terminal areas comprise:
   three areas spaced apart from each other and are symmetric about the center line.

3. The substrate of claim 1, wherein,
   the plurality of device areas comprise four areas, and
   two areas of the four areas are conductive layer areas spaced apart from each other with the center line therebetween, and a remaining two areas are a same conductive layer area crossing the center line.

4. The substrate of claim 1, further comprising:
   a second substrate is mounted on a portion of the plurality of control pin areas.

5. The substrate of claim 4, wherein the second substrate comprises:
an insulation layer contacting the portion of the plurality of control pin areas; and
a plurality of conductive layers spaced apart from each other, the plurality of conductive layers being disposed on the insulation layer.

6. A power module comprising:
a substrate including,
a plurality of input teitainal areas configured to mount input terminals thereon,
a plurality of output terminal areas configured to mount output terminals thereon,
a plurality of device areas configured to mount devices thereon, and
a plurality of control pin areas configured to mount control pins thereon, wherein the plurality of control pin areas are disposed approximately along a center line connecting a central portion of the plurality of input terminal areas and a central portion of the plurality of output terminal areas, and the plurality of device areas are bilaterally symmetric about the plurality of control pin areas therebetween;
a plurality of first devices mounted on the plurality of device areas;
a plurality of first input terminals mounted on the plurality of input terminal areas;
a plurality of first control pins mounted on the plurality of control pin areas; and
a plurality of first output terminals mounted on the plurality of output terminal areas.

7. The power module of claim 6, further comprising:
a second substrate mounted on a portion of the plurality of control pin areas.

8. The power module of claim 7, wherein the second substrate comprises:
an insulation layer contacting the portion of the plurality of control pin areas; and
a plurality of conductive layers disposed on the insulation layer, the plurality of conductive layers spaced apart from each other.

9. The power module of claim 8, wherein a portion of the plurality of first control pins are mounted on the plurality of conductive layers.

10. The power module of claim 6, wherein the plurality of input terminal areas comprise:
three areas spaced apart from each other and being bilaterally symmetric about the center line.

11. The power module of claim 10, wherein the plurality of first input terminals are three first input terminals mounted on respective one of the three areas, and two of the three first input tenninals are configured to receive a voltage having a same polarity.

12. The power module of claim 11, wherein the three first input terminals are bilaterally symmetric about the center line.

13. The power module of claim 12, wherein the three first input terminals comprise:
two coupling parts.

14. The power module of claim 7, wherein the second substrate, a portion of the first devices and one of the first input telininals are mounted on a same conductive layers.

15. A power module comprising:
a substrate including device modules and control pins, the control pins having first ends mounted to the substrate and the device modules being symmetrically mounted to the substrate with respect to the control pins, the control pins configured to receive a signal to control switching of the modules;
input terminals electrically connected to the substrate, the input terminals being symmetrically mounted with respect to the control pins; and
an output terminal electrically connected to the substrate, the output terminal being symmetrically mounted with respect to the control pins,
wherein the control pins are mounted approximately along a center of the substrate.

16. The power module of claim 15, wherein a variation in an inductance in each of the device modules is less than 15%.

17. The power module of claim 15, further comprising:
a second substrate mounted to the substrate, the second substrate electrically insulated from the device modules.

18. The power module of claim 15, wherein the input terminals include at least three input terminals and two of the three input teiminals are configured to receive a voltage having a same polarity and a third of the three input terminals is configured to receive a voltage having a polarity opposite the same polarity.

19. The power module of claim 15, wherein the device modules include an insulated-gate bipolar transistor IGBT.

* * * * *